(12) United States Patent
Fenger et al.

(10) Patent No.: US 8,320,133 B1
(45) Date of Patent: Nov. 27, 2012

(54) RIGID/FLEXIBLE CIRCUIT BOARD

(75) Inventors: Harold S. Fenger, Thousand Oaks, CA (US); Ike Y. Chang, Santa Monica, CA (US); Richard W. Nichols, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 1159 days.

(21) Appl. No.: 11/951,100

(22) Filed: Dec. 5, 2007

Related U.S. Application Data

(60) Provisional application No. 60/868,659, filed on Dec. 5, 2006.

(51) Int. Cl.
*H05K 1/00* (2006.01)

(52) U.S. Cl. ......... 361/750; 361/749; 361/803; 174/254

(58) Field of Classification Search .......... 361/749–750, 361/795; 174/254–258
See application file for complete search history.

(56) References Cited

U.S. PATENT DOCUMENTS

| | | | | |
|---|---|---|---|---|
| 5,155,301 A | * | 10/1992 | Mase | 174/88 R |
| 6,506,978 B1 | * | 1/2003 | Furihata | 174/254 |
| 6,902,949 B2 | * | 6/2005 | Yamazaki et al. | 438/106 |
| 7,481,267 B2 | * | 1/2009 | Zhan et al. | 165/185 |
| 7,527,836 B2 | * | 5/2009 | Tazaki et al. | 428/1.2 |
| 2005/0051607 A1 | * | 3/2005 | Wang et al. | 228/246 |

* cited by examiner

*Primary Examiner* — Tuan T Dinh
(74) *Attorney, Agent, or Firm* — Cantor Colburn LLP

(57) ABSTRACT

According to one embodiment, a circuit board comprises an anisotropic film disposed outwardly from a first flexible dielectric layer, and a second flexible dielectric layer disposed outwardly from the anisotropic film. The first and second flexible dielectric layers each have at least one conductive trace conductively coupled to a pad. The anisotropic film forms a via region that conductively couples the pad of the first flexible dielectric layer to the pad of the second flexible dielectric layer, and electrically isolates the conductive trace of the first flexible dielectric layer from the conductive trace of the second flexible dielectric layer.

8 Claims, 3 Drawing Sheets

RIGID/FLEXIBLE CIRCUIT BOARD

RELATED APPLICATIONS

This application claims priority to U.S. Patent Application Ser. No. 60/868,659, entitled "RIGID-FLEXIBLE ELECTRONIC CIRCUIT BOARD," which was filed on Dec. 5, 2006.

TECHNICAL FIELD OF THE DISCLOSURE

This disclosure relates generally to circuit boards, and more particularly to a rigid/flexible circuit board and method of manufacturing the same.

BACKGROUND OF THE DISCLOSURE

An electronic circuit typically includes a number of electrical components that are disposed on a generally rigid circuit board. The circuit boards may have a generally planar surface to which the electrical components are attached. The circuit board maintains the positions of components and allows for placement of the electronic circuit within an enclosure.

SUMMARY OF THE DISCLOSURE

According to one embodiment, a circuit board comprises an anisotropic film disposed outwardly from a first flexible dielectric layer, and a second flexible dielectric layer disposed outwardly from the anisotropic film. The first and second flexible dielectric layers each have at least one conductive trace conductively coupled to a pad. The anisotropic film forms a via region that conductively couples the pad of the first flexible dielectric layer to the pad of the second flexible dielectric layer, and electrically isolates the conductive trace of the first flexible dielectric layer from the conductive trace of the second flexible dielectric layer.

Particular embodiments of the present disclosure may exhibit some, none, or all of the following technical advantages. For example, various embodiments may provide a rigid/flexible circuit board that may be laid on a generally flat surface for attachment of electrical components, and subsequently bent to conform to the contour of a non-planar object. As another example, rigid boards may be electrically coupled together without requiring wire bundles or flat ribbons with connectors to couple the rigid boards to one another.

Other technical advantages will be readily apparent to one skilled in the art from the following figures, description, and claims.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF THE EMBODIMENTS

As described previously, electrical circuits usually comprise a generally rigid circuit board on which electrical components are disposed. Many electronic circuits, however, may benefit from a circuit board that can be bent to conform to the contours of a non-planar object. For example, an active phased array antenna may be placed on an aircraft's non-planar surface to enhance transmission and reception of radio frequency (RF) signals.

Figure 1:
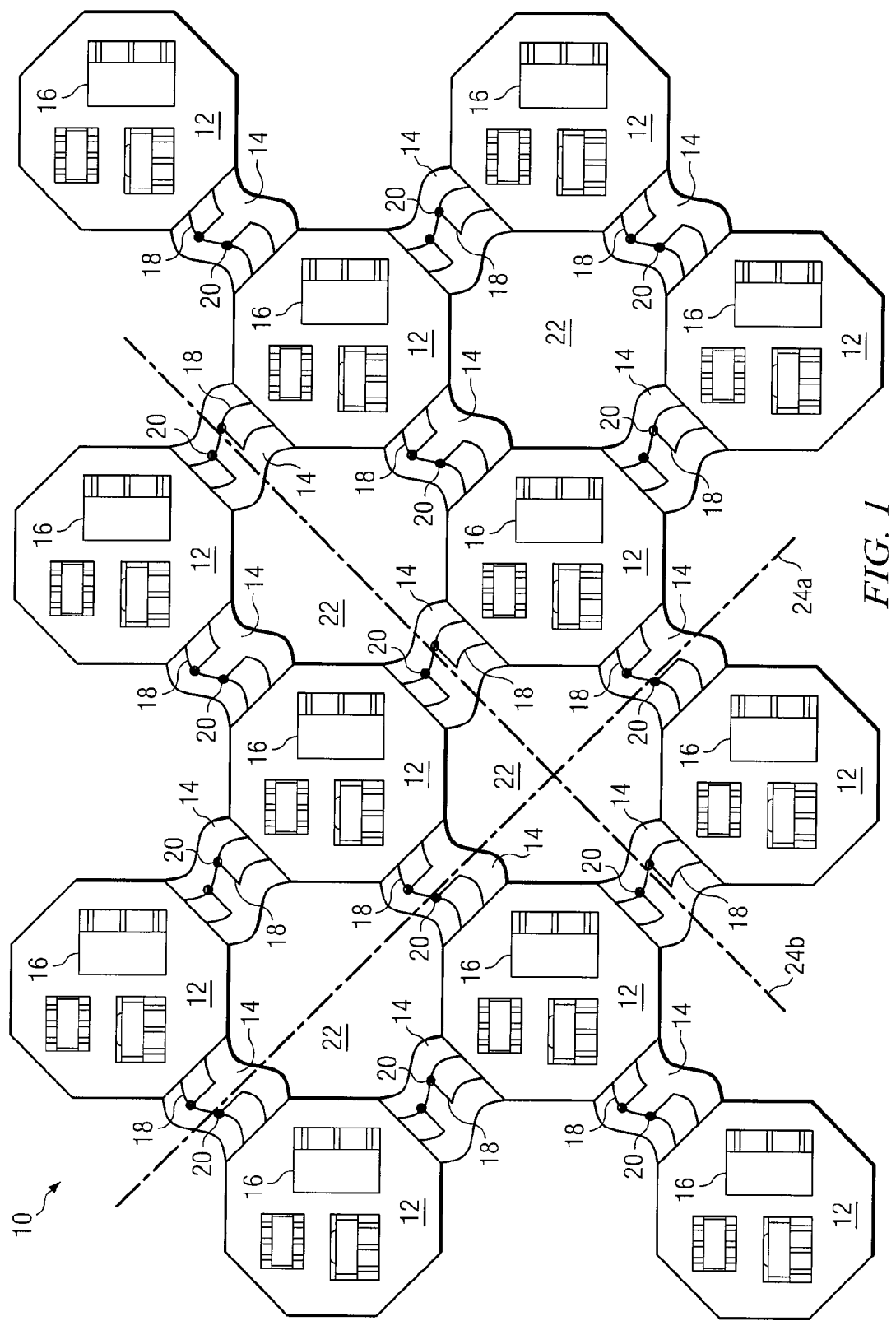
FIG. 1 is a plan view of one embodiment of a rigid/flexible circuit board according to the teachings of the present disclosure.

FIG. 1 shows one embodiment of a rigid/flexible circuit board 10 according to the teachings of the present disclosure. Rigid/flexible circuit board 10 has rigid boards 12 that are coupled together by a flexible substrate 14 as shown. Electrical components 16 are disposed outwardly from rigid boards 12. Apertures 22 are located between adjacent rigid boards 12. Flexible substrate 14 includes conductive traces 18 that may be electrically coupled to one or more pads 20. Conductive traces 18 electrically couple electrical components 16 of one rigid board 12 to electrical components 16 of another rigid board 12.

Rigid boards 12 are generally stiff for attachment of electrical components 16 to their surface. Rigid boards 12 provide structural integrity for the electrical components 16, and the flexible substrate 14 allows bending of rigid/flexible circuit board 10 along any suitable multi-dimensional contour, such as a convex or a concave contour. Flexible substrate 14 forms hinge-like structures that allow for one rigid board 12 to be moved relative to adjacent rigid boards 12 along differing axes 24a and 24b.

Rigid boards 12 may comprise any suitable insulative material and may include conductive layers for coupling electrical components 16 to one another and to conductive traces 18. Examples of insulating materials include quartz ($SiO_2$), phenolic paper, glass fiber, and plastics. Another example includes a combination of glass fiber mat, nonwoven insulating material, and resin, G-10 (a woven glass and epoxy combination), or polytetrafluoroethylene (PFTE) (commonly referred to as Teflon®).

In one embodiment, rigid boards 12 comprise quartz ($SiO_2$) and copper that is disposed outwardly from rigid boards 12. The material may be disposed using techniques for molecular evaporation in a vacuum. Quartz exhibits relatively good heat conductivity for conducting heat away from electrical components 16 during operation. Quartz also has relatively good dielectric constant properties that do not unduly alter the performance of electrical components 16. Rigid boards 12 made of quartz may be deposited outwardly from flexible substrate 14 using lithographic processes.

In another embodiment, rigid boards 12 may be deposited outwardly from flexible substrate 14 by electrophoretic deposition (EPD). In electrophoretic deposition, colloidal particles are suspended in a liquid medium and migrate under the influence of an electric field (electrophoresis) resulting in deposition onto an electrode. Colloidal particles that can be used to form stable suspensions and that can carry a charge can be used in electrophoretic deposition. Examples of such particles include material classes such as polymers, pigments, dyes, ceramics, and metals. Examples of other techniques that may be used include sputtering, chemical vapor deposition, and stereo lithographic three dimensional processes.

Certain embodiments of rigid/flexible circuit board 10 may provide rigid boards 12 that are flexibly coupled to one another without connectors. Known processes typically couple wire bundles or flat ribbons to already manufactured rigid boards with connectors. Rigid/flexible circuit board 10 may be created using a manufacturing process that electrically couples rigid boards 12 together without connectors in some embodiments.

Flexible substrate 14 may comprise any flexible material to which rigid boards 12 and conductive traces may be disposed. The material may remain stable during deposition of rigid boards 12 and/or conductive traces 18 at relatively high temperatures. In one embodiment, the material may be a heat-resistant polymeric material that remains relatively stable in temperatures up to 400 degrees Celsius, such as Kapton® film available from DuPont Corporation.

Figure 2:
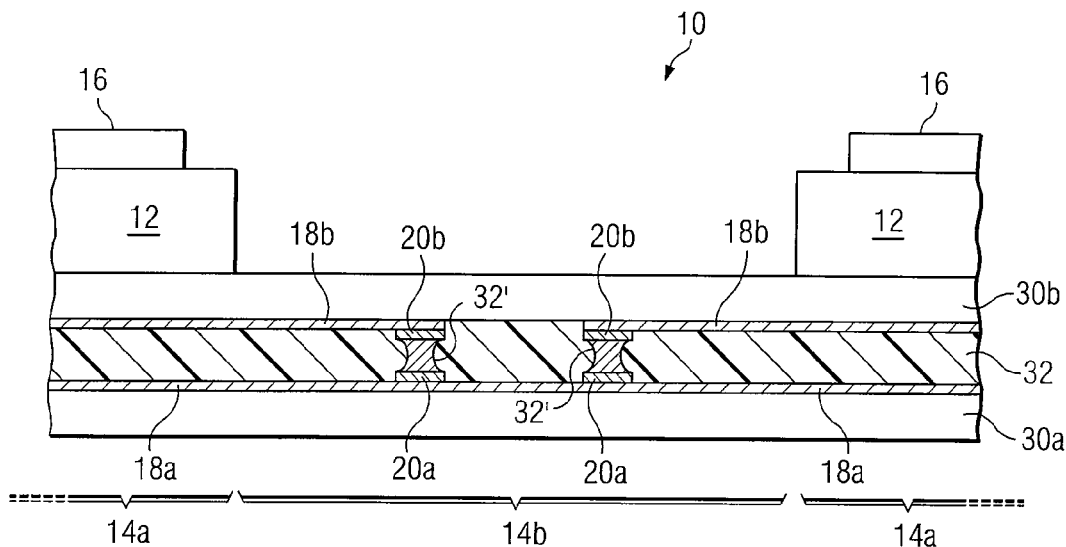
FIG. 2 is a partial, cross-sectional view of a portion of the rigid/flexible circuit board of FIG. 1.

FIG. 2 shows an enlarged, cross-sectional view of rigid/flexible circuit board 10 showing flexible substrate 14. Flexible substrate 14 has flexible dielectric layers 30a and 30b that are bonded together by an anisotropic film 32. Although flexible substrate 14 has two flexible dielectric layers 30, other flexible substrates 14 may have any number of flexible dielectric layers 30. For example, flexible substrate 14 may have three flexible dielectric layers 30 that are bonded together by two layers of anisotropic film 32.

Flexible substrate 14 comprises a generally rigid region 14a and a flexible region 14b. Rigid region 14a generally includes a portion of flexible substrate 14 that is attached to rigid boards 12. Flexible region 14b generally includes a portion between rigid boards 12.

Each flexible dielectric layer 30 has one or more conductive traces 18 conductively coupled to one or more pads 20 as shown. Conductive traces 18 and pads 20 may comprise any suitable conductive material, such as copper. Conductive traces 18 and pads 20 may be deposited on flexible substrate 14 using any suitable process, such as a lithographic process.

Anisotropic film 32 has via regions 32' that conductively couple pads 20a to pads 20b. Anisotropic film 32 also electrically isolates conductive traces 18a from conductive traces 18b. That is, anisotropic film 38 forms via regions 32' between pads 20 while electrically isolating other portions of flexible dielectric layer 30, such as conductive traces 18.

Via regions 32' may be flexible to avoid cracking when flexible substrate 14 is bent. In one embodiment, via regions 32' may comprise material that provide relatively reliable interconnections through various types of physical strain. For example, anisotropic film may comprise nano-materials, such as nano-engineered carbon nanotubes dispersed in a resin impregnated binder, which may promote heat dissipation.

In another embodiment, anisotropic film 32 may comprise a transient liquid phase alloy that forms via regions 32' adapted for power interconnects. The transient liquid phase alloy may include copper and/or solder that has coefficient of thermal expansion (CTE) values relatively similar to that of conductive traces 18. In this manner, the interconnect reliability of via regions 32' may be maintained over a relatively wide thermal range. In another embodiment, anisotropic film 32 may comprise nanofoil material. The nanofoil material may enhance heat dissipation between flexible dielectric layers 30. Certain embodiments utilizing nano-foil chemistry may provide a relatively high level of thermal dissipation.

Figure 3:
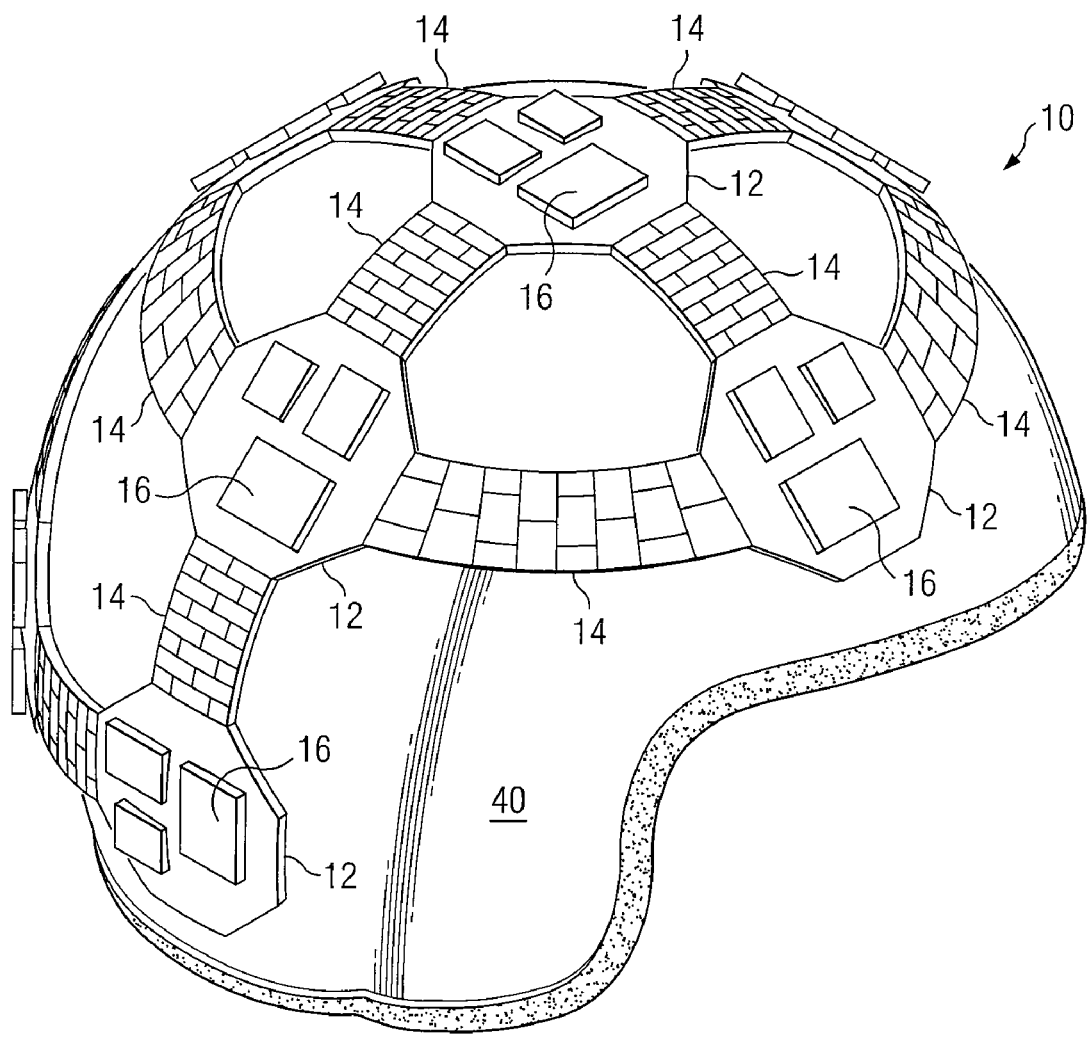
FIG. 3 is a side elevational view of the rigid/flexible circuit board of FIG. 1 that is disposed on a helmet.

FIG. 3 shows one example of rigid/flexible circuit board 10 disposed on a non-planar object, for example a helmet 40. Helmet 40 may be a military helmet that may be used to protect the head of a soldier during combat. In one embodiment, rigid/flexible circuit board 10 may be configured as an active phased array antenna. In the embodiment, electrical components 16 of rigid boards 12 may include transmit/receive (T/R) modules, radiating elements, and/or other electrical components 16. Rigid/flexible circuit board 10 may alternatively select one or more of the transmit/receive modules for transmitting or receiving electro-magnetic signals at any one time. For example, the transmit/receive modules that are physically oriented towards a desired direction transmit or receive signals. Battery power may be conserved in this manner. Additionally, signal interception by unwanted recipients may be effectively reduced in some embodiments.

Modifications, additions, or omissions may be made to rigid/flexible circuit board 10 without departing from the scope of the disclosure. For example, via regions 32' may comprise any suitable material that anisotropically couples pads 20 of one flexible dielectric layer 30 to a pad 20 of another flexible dielectric layer 30. Moreover, rigid/flexible circuit board 10 may comprise more, fewer, or other elements. For example, rigid/flexible circuit board 10 may include electrical components 16 that are disposed outwardly from rigid boards 12 as well as electrical components 16 that are disposed outwardly from flexible substrate 14. As used in this document, "each" refers to each member of a set or each member of a subset of a set.

Figure 4:
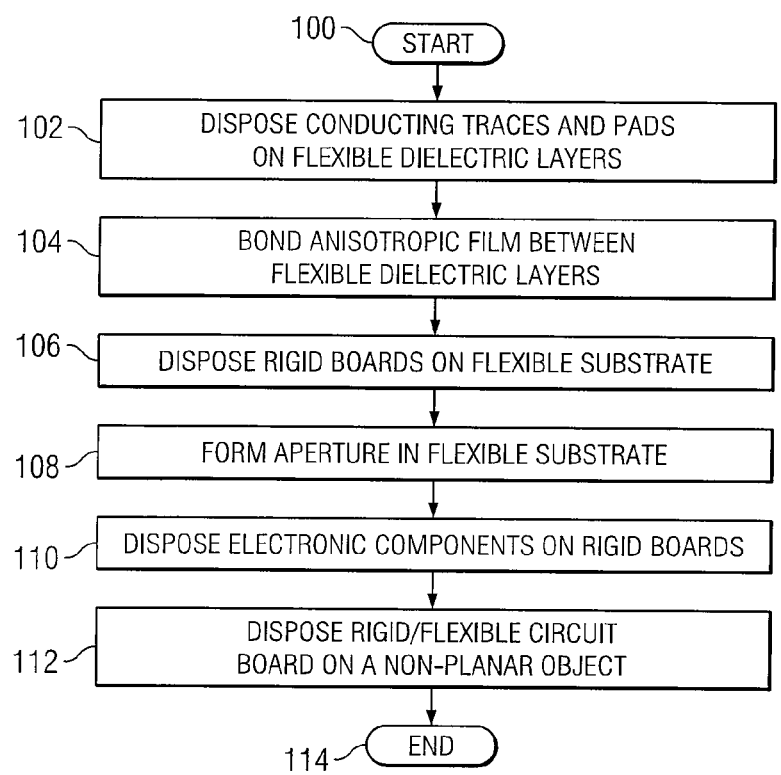
FIG. 4 is a flowchart of one embodiment of a series of steps that may be performed in order to manufacture the rigid/flexible circuit board.

FIG. 4 shows one embodiment of a sequence of steps that may be performed in order to manufacture rigid/flexible circuit board 10. In act 100, the manufacturing process is initiated.

In step 102, one or more conducting traces 18 and pads 20 may be disposed over flexible dielectric layers 30. In one embodiment, a copper material may be disposed over flexible dielectric layers 30 made of a high temperature polymeric material using a lithographic process.

In step 104, anisotropic film 32 is bonded between flexible dielectric layers 30 to form flexible substrate 14. Anisotropic film 32 may include a bonding agent that bonds to flexible dielectric layers 30. In one embodiment, anisotropic film 32 is bonded to flexible dielectric layers 30 using a heat pressing process. For embodiments incorporating anisotropic films 32 made of nano-anisotropic materials, the heat pressing process forms via regions 32' by creating electrical conducting paths between adjacent pads 20. Heat generated by the heat pressing process may be used to cure the adhesive agent.

In step 106, rigid boards 12 may be disposed outwardly form flexible substrate 14. In one embodiment, a material may be deposited outwardly from flexible substrate 14 using a lithographic process. The material may be relatively rigid when cured and comprise quartz. In another embodiment, rigid boards 12 may be formed of quartz. The outer periphery of rigid boards 12 may be formed by cutting away unwanted portions of rigid boards 12 using a laser beam.

In step 108, apertures 22 may be formed in flexible substrate 14 between adjacent rigid boards 12. Apertures 22 may be formed using any suitable process, such as by laser cutting or by mechanically scribing flexible substrate 14.

In step 110, electrical components 16 may be disposed outwardly from rigid boards 12. In one embodiment, electrical components 16 may be disposed outwardly from rigid boards 12 while rigid/flexible circuit board 10 is on a generally flat surface. Known circuit assembly tools, such as pick-and-place machines and/or solder reflow machines, may assemble electrical components 16 on rigid/flexible circuit board 10 while rigid/flexible circuit board 10 is flat.

In step 112, rigid/flexible circuit board 10 may be disposed on a non-planar object. That is, rigid/flexible circuit board 10 may be bent in order to conform to the contour of the non-planar object. Examples of suitable non-planar objects may include helmets 40 or the outer surface of a vehicle, such as an aircraft.

In step 114, the process ends.

Modifications, additions, or omissions may be made to the method without departing from the scope of the disclosure. The method may include more, fewer, or other steps. For example, the method described above uses a heat pressing process that bonds the flexible dielectric layers together and forms via regions 32' between adjacent pads 20. Other bonding techniques may be used in conjunction with other suitable anisotropic films to form via regions 32' between pads 20.

Although several embodiments have been illustrated and described in detail, it will be recognized that substitutions and alterations are possible without departing from the spirit and scope of the present disclosure, as defined by the following claims.

What is claimed is:

1. A circuit board, comprising:
   a first flexible dielectric layer having a first conductive trace conductively coupled to a first pad;
   an anisotropic film disposed outwardly from the first flexible dielectric layer;
   a second flexible dielectric layer disposed outwardly from the anisotropic film, the second flexible dielectric layer having a second conductive trace conductively coupled to a second pad, the anisotropic film forming a via region that conductively couples the first pad to the second pad, the anisotropic film being in contact with both the first conductive trace and the second conductive trace and electrically isolating the first conductive trace from the second conductive trace; and
   at least three rigid boards disposed outwardly from the second flexible dielectric layer, the at least three rigid boards defining an area between the at least three rigid boards, an aperture formed in the area.

2. The circuit board of claim 1, the anisotropic film comprising a nano-anisotropic film.

3. The circuit board of claim 1, wherein the at least three rigid boards comprise quatz.

4. The circuit board of claim 1, the first flexible dielectric layer and the second flexible dielectric layer comprising a heat-resistant polymeric material resistant to temperatures up to 400 degrees Celsius.

5. The circuit board of claim 1, the anisotropic film comprising carbon nanotubes.

6. The circuit board of claim 1, the anisotropic film comprising a transient liquid phase sinter alloy of copper and solder.

7. The circuit board of claim 1, the anisotropic film comprising nanofoil.

8. A circuit board, comprising:
   a first flexible dielectric layer having a first conductive trace conductively coupled to a first pad;
   an anisotropic film disposed outwardly from the first flexible dielectric layer, the anisotropic film selected from one of the groups consisting of:
      a nano-anisotropic film;
      carbon nanotubes;
      a transient liquid phase sinter alloy of copper and solder; and
      nanofoil;
   a second flexible dielectric layer disposed outwardly from the anisotropic film, the second flexible dielectric layer having a second conductive trace conductively coupled to a second pad, the anisotropic film forming a via region that conductively couples the first pad to the second pad, the anisotropic film electrically isolating the first conductive trace from the second conductive trace, the first flexible dielectric layer and the second flexible dielectric layer comprising a heat-resistant material resistant to temperatures up to 400 degrees Celsius; and
   at least three rigid boards disposed outwardly from the second flexible dielectric layer, the at least three rigid boards defining an area between the at least three rigid boards, an aperture formed in the area, the rigid boards comprising one or more electrical components, the rigid boards comprising quartz.

* * * * *